US005945781A

United States Patent [19]

Valentian

[11] Patent Number: 5,945,781

[45] Date of Patent: Aug. 31, 1999

[54] ION SOURCE WITH CLOSED ELECTRON DRIFT

[75] Inventor: Dominique Valentian, Rosny, France

[73] Assignee: Societe Nationale D'Etude et de Construction de Moteurs D'Aviation, Paris, France

[21] Appl. No.: 08/773,401

[22] Filed: Dec. 26, 1996

[30] Foreign Application Priority Data

Dec. 29, 1995 [FR] France .................................. 95 15718

[51] Int. Cl.[6] .............................. H01J 37/08; F03H 5/00

[52] U.S. Cl. ................................ 315/111.81; 315/111.91; 60/202; 313/362.1

[58] Field of Search .......................... 315/111.81, 111.91; 313/362.1; 60/202; 250/423 R

[56] References Cited

U.S. PATENT DOCUMENTS

| | | | |
|---|---|---|---|
| 3,735,591 | 5/1973 | Burkhart | 60/202 |
| 5,475,354 | 12/1995 | Valentian et al. | 335/296 |
| 5,763,989 | 6/1998 | Kaufman | 315/111.91 X |

FOREIGN PATENT DOCUMENTS

| | | |
|---|---|---|
| 0265365 | 4/1988 | European Pat. Off. . |
| 2693770 | 1/1994 | France . |
| 2712829 | 9/1978 | Germany . |

OTHER PUBLICATIONS

The Culham Study Group: "Neutral Injection Heating of Toroidal Reactors", 1971, Culham Laboratory, Abingdon Berkshire XP002013816.

"Theory of Ion Acceleration with Closed Electron Drift", H. Kaufmann, Journal of Spacecraft and Rockets, vol. 21, Nov.–Dec. 21, 1984, No. 6, New York, pp. 558–562, XP002013815.

*Primary Examiner*—Benny T. Lee
*Assistant Examiner*—Justin P. Bettendorf
*Attorney, Agent, or Firm*—Weingarten, Schurgin, Gagnebin & Hayes LLP

[57] ABSTRACT

A closed electron drift ion source comprising a main annular channel for ionization and acceleration that is open at its downstream end, and that has at least an inside wall constituted by a material that is electrically conductive. Terminal parts taken to a potential that is lower than that of an anode extend the downstream end of the annular channel. The ion source also includes a hollow cathode, ionizable gas feed means associated with the cathode, and with the anode, anode bias means, and means for creating a magnetic field in the main annular channel. The invention is particularly applicable to industrial treatment methods.

22 Claims, 10 Drawing Sheets

FIG_4A
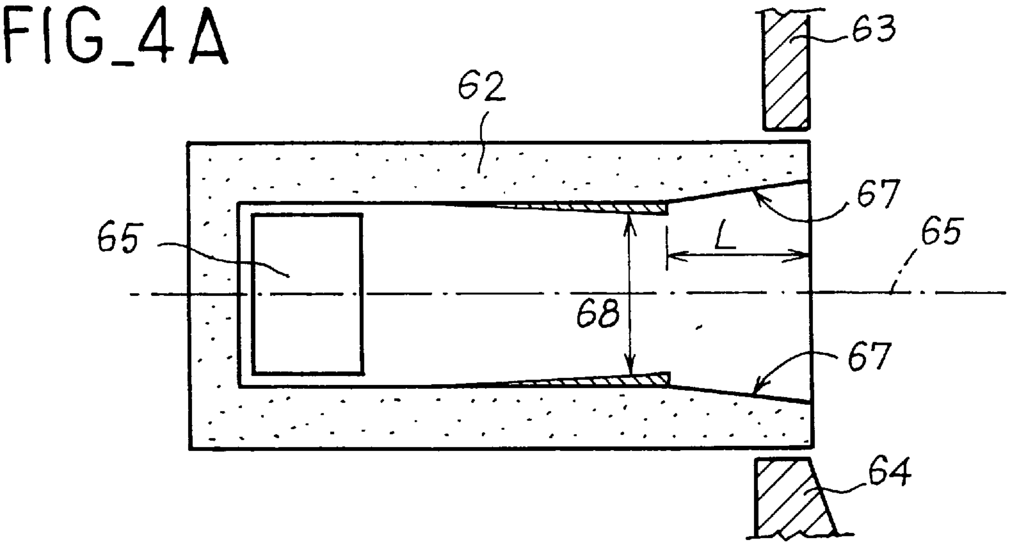
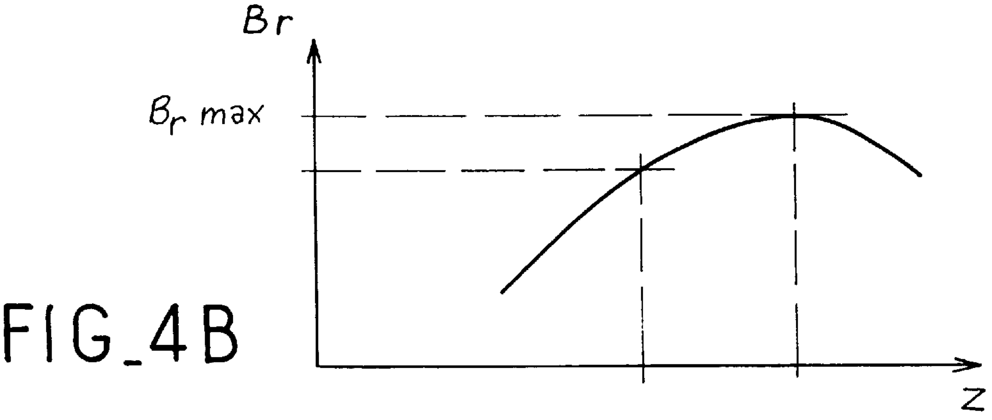
FIG_4B
PRIOR ART
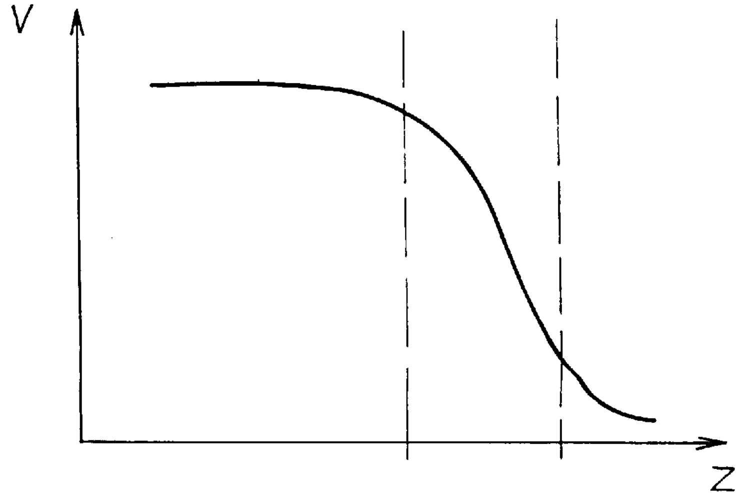
FIG_4C
PRIOR ART

ION SOURCE WITH CLOSED ELECTRON DRIFT

FIELD OF THE INVENTION

The present invention relates to closed electron drift ion sources that can be used as thrusters, more particularly for space vehicles, or as ion sources for industrial treatments such as, in particular, vacuum deposition, ion assisted deposition (IAD), or dry etching of microcircuits.

PRIOR ART

Ion beam industrial treatments can make use of grid ion sources or of closed electron drift ion sources. Both of those types of ion source were initially developed for use in space (ion thrusters or plasma thrusters).

Grid sources, known as ion bombardment thrusters, were invented by Prof. Kaufman in 1961.

Those sources produce ions at relatively high energy (500 eV to 1000 eV) and relatively low beam density (2 mA/cm$^2$ to 6 mA/cm$^2$) at the grid. They are well adapted to certain applications such as fine deep etching or uniform ion erosion of targets.

In other applications (cleaning surfaces in a vacuum, fast ion machining, or IAD), it is preferable to reduce ion energy and increase ion density. That can be done with closed electron drift sources (i.e. having no grid).

There exist three types of closed electron drift source:

stationary plasma thrusters (SPT);

anode layer thrusters (ALT); and the ion source patented by Prof. Kaufman.

Kaufman's source is described in European patent 0 265 365. It uses a conical anode and an axial counter-electrode. That source is used essentially for IAD.

FIG. 1 shows a closed electron drift plasma thruster as proposed in an article by L. H. Artsimovitch et al., published in 1974 in "Machineostroenie", pp. 75–84 in the context of the program for developing the stationary thruster and testing it on the "METEOR" satellite.

Such thrusters of the "closed electron drift" type, or stationary plasma thrusters differ from other categories in that no distinction is made between ionization and acceleration, and the acceleration zone includes equal numbers of ions and of electrons, thereby eliminating any space charge phenomenon.

In FIG. 1, there can be seen an annular channel 1 defined by a part 2 made of insulating material and placed in an electromagnet having outer and inner annular pole pieces 3 and 4 placed respectively outside and inside the part 2 made of insulating material, a magnetic yoke 12 disposed at the upstream end of the accelerator, and electromagnet coils 11 extending along the entire length of the channel 1 and connected in series around magnetic cores 10 interconnecting the outer pole piece 3 and the yoke 12. A hollow cathode 7 connected to ground is coupled to a xenon feed device for forming a cloud of plasma before the downstream outlet of the channel 1. An annular anode 5 connected to the positive pole of an electrical power supply, e.g. at 300 volts, is disposed in the closed upstream portion of the annular channel 1. A xenon injection tube 6 co-operating with a thermal and electrical insulator 8 opens out into an annular distribution channel 9 disposed in the immediate vicinity of the annular anode 5.

Ionization and neutralization electrons come from the hollow cathode 7. Ionization electrons are attracted into the insulating annular channel 1 by the electric field that exists between the anode 5 and the plasma cloud coming from the cathode 7.

Under the effect of the electric field E and of the magnetic field B created by the coils 11, the ionization electrons follow an azimuth drift trajectory necessary for maintaining the electric field in the channel.

The ionization electrons then drift along closed trajectories inside the insulating channel, hence the name of the thruster.

The drift motion of the electrons considerably increases the probability of electrons colliding with neutral atoms, which phenomenon produces the ions (in this case of xenon).

The specific impulse obtained by conventional closed electron drift ion thrusters operating on xenon is of the order of 1000 seconds (s) to 2500 s.

Stationary plasma thrusters developed by Prof. Morozov have been used intensively for space propulsion.

FIG. 2 is an axial section through one example of a thruster developed by Prof. Morozov and constituting the subject matter of publication in document FR-A-2 693 770.

Like the thruster of FIG. 1, that thruster 20 comprises an annular channel 21 defined by a part 22 made of insulating material, a magnetic circuit comprising outer and inner annular pieces **24*a* and 24*b*, a magnetic yoke 32 disposed at the upstream end of the thruster, and a central core 28 interconnecting the annular pieces 24*a* and 24*b* and the magnetic yoke 32. Coils 31 enable a magnetic field and an electric field to be created in the annular channel. The hollow cathode 40 is coupled to a xenon feed device to form a cloud of plasma before the downstream outlet of the channel 21. That accelerator is characterized by the presence of a plenum chamber 23 that extends in the radial direction over a greater distance than does the main annular channel 21. An anode 25 is disposed on the insulating parts 22 defining the annular channel 21, in a zone situated immediately downstream from the plenum chamber 23. An annular manifold 27 for ionizable gas is located at the end of the plenum chamber 23**.

In conventional closed electron drift accelerators, as described with reference to FIG. 1, a considerable portion of the ionization is localized in the middle portion. A fraction of the ions strike the walls giving rise to rapid wear of the walls, thereby reducing the lifetime of the thruster. The energy distribution of the electrons in the plasma can be reduced by the magnetic field distribution imposed by the shapes of the pole piece acting on the electrodes entering into the channel. As a result electrical potential is smaller along the magnetic field lines, thereby reducing the divergence of the ion beam over the walls and thus avoiding ion losses by collision therewith, which has the effect of increasing efficiency and reducing the divergence of the beam at the outlet from the accelerator. By acting on the ratio of the currents carried by the coils, it is possible, on the contrary, to create a field distribution that prevents the low divergence mode being reached (e.g. by causing the radial field to vary monotonically in the outlet plane between the outer pole piece and the inner pole piece).

High beam divergence is beneficial in certain industrial applications such as IAD (Ion Assisted Deposition)on spherical caps.

Still more recently, the characteristics of SPTs have been described in several publications including 23rd International Electric Propulsion Conference (Seattle, September 1993), IEPC-93-222 "The development and characteristics of high power SPT models", by S. Absalyamov, V. Kim and S. Khartov, Moscow Aviation Institute, Moscow, Russia; B. Arkhipov, S. Kudryavisev and N. Masiennikov, Fakel Enterprise Kaliningrad, Russia; T. Colbert and M. Day, Space Systems/Loral, Palo Alto, Calif.; A. Morozov and A. Veselovzorov, Institute of Atomic Energy, Moscow, Russia.

Anode layer thrusters (ALTs) are described in Russian publications, e.g.: Fizika Plasmi, Plasmennie uckoritelli i ionnie injectori, Moscow 1984: Plasmennie uckoriteli c andnim cloem, V. I. Garkusha, L. V. Leckov, E. A. Lyapin, and more recently in international conferences:

23rd IEPC Conference

IEPC-93-227, "Physical principles of anode layer accelerators", A. Zharinov and E. Lyapin, Central Research Institute of Machine Building, Kaliningrad (Moscow region), Russia;

IEPC-93-228, "Anode layer thruster: state of the art perspectives", E. Lypain, V. Garkusha and A. Semenkin, Central Research Institute of Machine Building, Kaliningrad (Moscow region), Russia;

IEPC-93-229, "Special feature of dynamic processes in a single-stage anode layer thruster", E. Lyapin, V. Padogomova and S. Semenkin, Central Research Institute of Machine Building, Kaliningrad (Moscow region), Russia.

30th AIAA Conference on Propulsion

AIAA-94-3011, "Operating characteristics of the Russian D-55 thruster with anode layer", John M. Sankovic and Thomas W. Haag, NASA Lewis Research Center, Cleveland, Ohio and David H. Manzella, NYMA, Inc. Brook Park Ohio.

FIG. 3 is a section through an anode layer thruster (ALT). The magnetic circuit is very close to that of a first generation stationary plasma thruster (SPT). It comprises a central pole piece 54 having an inner coil 61 wound thereabout and serving as a support for the thruster, together with an outer annular pole piece 53, said two grounded pole pieces being inter-connected by magnetic cores 60 supporting outer coils 61.

Unlike stationary plasma thrusters (SPTs) in which the walls of the acceleration channel are insulating, the walls 56 of the acceleration channel 51 of anode layer thrusters (ALTs) are constituted by a conductive metal material. A solid anode 55 and a cathode 59 also serve to deliver the propellant gases. The solid anode 55 occupies the major portion of the acceleration chamber, the acceleration channel 51 being restricted to a very thin zone situated between the solid anode 55 and the conductive walls 56 (hence the name anode layer thruster). All of the portions of the thruster that come into contact with the discharge are made of metal.

An examination of stationary plasma thrusters (SPTs) and of anode layer thrusters (ALTS) shows that they are not entirely adapted to industrial use.

As can be seen in FIG. 4A which relates to a conventional plasma thruster having an acceleration channel completely defined by an insulating part 62, the inside surface defining the acceleration channel is subdivided into two zones when the thruster is in operation. The downstream zone 67 of length L (which length L may have a value of about 5 mm to 7 mm for a thruster having a diameter of 100 mm) corresponds to a zone that is continuously eroded by ion bombardment. In contrast, the upstream zone 68 corresponds to a zone in which the eroded matter is deposited.

FIG. 4B shows how the radial component of the magnetic induction $B_r$ varies as a function of axial position Z on an ideal cylindrical surface 65 corresponding to the mean radius of the acceleration channel.

FIG. 4C shows how potential V varies as a function of axial position Z on the same ideal cylindrical surface 65 corresponding to the mean radius of the acceleration channel.

When considering FIGS. 4A, 4B, and 4C simultaneously, it can be seen that the eroded zone 67 (FIG. 4A) corresponds to a high radial magnetic field $B_r$ (FIG. 4B).

In contrast, the deposition zone 68 (FIG. 4A) corresponds to a potential gradient that is nearly zero (FIG. 4C) and to a radial magnetic field $B_r$ that is relatively small (FIG. 4B). Operation of the thruster is associated with plasma/wall interactions, and in particular on the secondary emission characteristics of the wall. Secondary emission properties may differ in the zones 67 and 68.

Since the channels of plasma thrusters comprise boron nitride, channel erosion can cause boron atoms to be applied to the substrate that is to be treated. That can be particularly harmful for microelectronic applications since boron is a dopant for silicon.

Also, in industrial treatments, it must be possible to adapt the gas to the treatment of the materials in contact with the discharge. Unfortunately, stationary plasma thrusters, like anode layer thrusters, have anodes that are practically impossible to dismount, thus making it difficult to change from oxygen to argon.

Finally, plasma thrusters having an acceleration channel defined by parts that are entirely made of ceramics, as described with reference to FIGS. 1, 2, and 4A, suffer from drawbacks insofar as the ceramic channel needs to satisfy contradictory requirements: resistance to sputtering, mechanical strength, resistance to thermal gradient, and resistance to thermal shock.

In practice, the resulting resistance to sputtering from the ions leads to the accelerator having a limited lifetime.

Also, it is necessary to have a ceramic part that is rather thick in order to have mechanical strength, thereby causing the pole pieces to be relatively far apart which can have a harmful effect on the geometry of the field.

In addition, it is difficult to produce ceramic channel parts industrially because of their complicated shapes.

OBJECT AND BRIEF DESCRIPTION OF THE INVENTION

The object of the present invention is to remedy the drawbacks of known closed electron drift ion sources, and more particularly to modify them to provide greater flexibility in use. The improvements of the invention seek specifically to reduce the mass of such sources while increasing their longevity, to simplify the manufacture of such sources while facilitating dismantling thereof, and to increase their mechanical strength.

The invention also seeks to reduce the emission of particles that result from erosion of the walls of the acceleration channel, thereby enabling such sources to be used effectively as ion sources in large-scale industrial treatments, whereas until now the structure of such sources has limited their use essentially to propelling satellites or other space vehicles.

All of these advantages are achieved by a closed electron drift ion source comprising a main annular channel for ionization and acceleration having an open downstream end, at least one hollow compensation cathode disposed outside the main annular channel, means for creating a magnetic field in the main annular channel, adapted to produce an essentially radial magnetic field in said channel having a gradient with maximum induction at the downstream end of the channel, first ionizable gas feed means associated with the hollow channel, and second ionizable gas feed means situated upstream from the main annular channel, and bias means co-operating with the anode; wherein at least the internal portion of the main annular channel thereof is made of an electrically conductive material, and wherein terminal pieces raised to a potential that is lower than the potential of the anode extend the annular channel downstream therefrom.

Insofar as it is particularly the downstream portion of the channel which is subjected to intense ion erosion, and which can thus possibly pollute the substrate to be treated with erosion products, the invention enables the downstream portion extending the channel to be extended using a material that is different from that constituting the main annular upstream portion of the channel, which material is essentially compatible with the partially ionized plasma-generating gas.

In a first embodiment of the invention, at least a portion of the main annular channel is electrically biased by bias means so that at least a portion of the inner wall of the main annular channel directly constitutes said anode.

In a particular embodiment of the invention, the main annular channel for ionization and acceleration is a one-piece unit constituted by an electrically conductive material.

More particularly, the main annular channel constitutes a main annular channel block that is closed upstream by a buffer chamber fed with plasma-generating gas by said second gas feed means comprising an annular manifold connected to a feed pipe.

In a particular embodiment, the means for creating a magnetic field comprise a magnetic circuit constituted by a yoke on which the main annular channel block is fixed, said yoke comprising an axial core supporting a central lower pole piece and a central upper pole piece that are concentric relative to the main annular channel block, said yoke also comprising a plurality of tie rods disposed around the annular channel block once it has been mounted on the yoke, said tie rods supporting a peripheral upper pole piece, said central and peripheral upper pole pieces constituting said terminal pieces taken to a potential that is lower than that of the anode, said upper pole pieces comprising guard rings disposed at the outlet of the main annular channel, which guard rings protect the pole pieces from erosion by ions in the plasma and, by means of their thickness, determine the profile of the magnetic field in the plasma. The guard rings are removable so as to enable the nature of the material constituting them to be adapted to the application using the ion source.

Advantageously, the main annular channel is electrically and thermally insulated by vacuum from the elements constituting the remainder of the ion source and comprising electrostatic screens, the gap between the main annular channel and the elements constituting the rest of the ion source lying in the range 1 mm to 5 mm.

In another aspect of the invention, the annular channel block is fixed to the magnetic yoke by a plurality of posts made of thermally insulating material and held in place by insulators, said posts being capable of being disconnected from the insulators to enable the annular channel block to be dismantled.

In another particular embodiment, the upper pole pieces comprise removable guard rings disposed at the outlet of the main annular channel.

Advantageously, under such circumstances the guard rings are made of one of the following conductive materials: carbon; carbon-carbon composite; nickel alloy; precious metal; ceramic composite constituted by nitrides bonded by silicon; silicon; stainless steel; and aluminum.

Another possibility is that the guard rings are made of one of the following insulating materials: boron nitride; alumina; and quartz.

The main annular channel block may be made of one of the following conductive materials: refractory nickel alloy; molybdenum; and carbon-carbon composite.

In one possible embodiment, a material to be evaporated is suitable for being deposited in the annular channel, and the inner walls of the annular channel are partially covered in an insulating deposit in order to avoid the electrically conductive material constituting said channel being attacked by the material to be evaporated.

In another particular embodiment, the inner walls of the annular channel block are plated in a precious metal such as platinum, gold, or rhodium, in order to eliminate chemical attacks due to the gases present in said channel.

In yet another particular embodiment of the invention, the outer walls and the inner walls of the main annular channel are made of an electrically conductive material, and are electrically insulated from the remainder of the structural elements of the source, including the anode.

In which case, advantageously, the said terminal pieces are made of a dielectric material covering a portion of the main annular channel.

More particularly, said terminal parts are made in the form of inserts of ceramic material that are fixed by means of supports on the pole pieces.

The electrically conductive walls of the annular channel and of the buffer chamber are at a floating potential that is slightly less than the potential of the anode. This disposition serves to reduce plasma/wall interactions, and thus to reduce channel heating. The channel can therefore be made out of relatively thin metal sheet.

The channel block is held relative to the magnetic circuit by posts of slightly conductive material. The anode is held relative to the channel block by insulators and is powered by a conductor lying on the axis of one of the posts.

The gas feed is at the same potential as the channel block.

BRIEF DESCRIPTION OF THE DRAWINGS

Other characteristics and advantages of the invention appear from the following description of particular embodiments given as non-limiting examples and described with reference to the accompanying drawings, in which:

FIG. 4A is a fragmentary axial section view of a prior art plasma thruster showing erosion of the down-stream portion of the channel;

FIG. 4B is a graph showing how the radial component $B_r$ of the magnetic induction varies as a function of position Z along an axial direction and at the mean radius of the FIG. 4A channel;

FIG. 4C is a graph showing the electric potential V of the plasma as a function of position Z along an axial direction and at the radius of the FIG. 4A channel;

DETAILED DESCRIPTION OF PARTICULAR EMBODIMENTS

Figure 5:
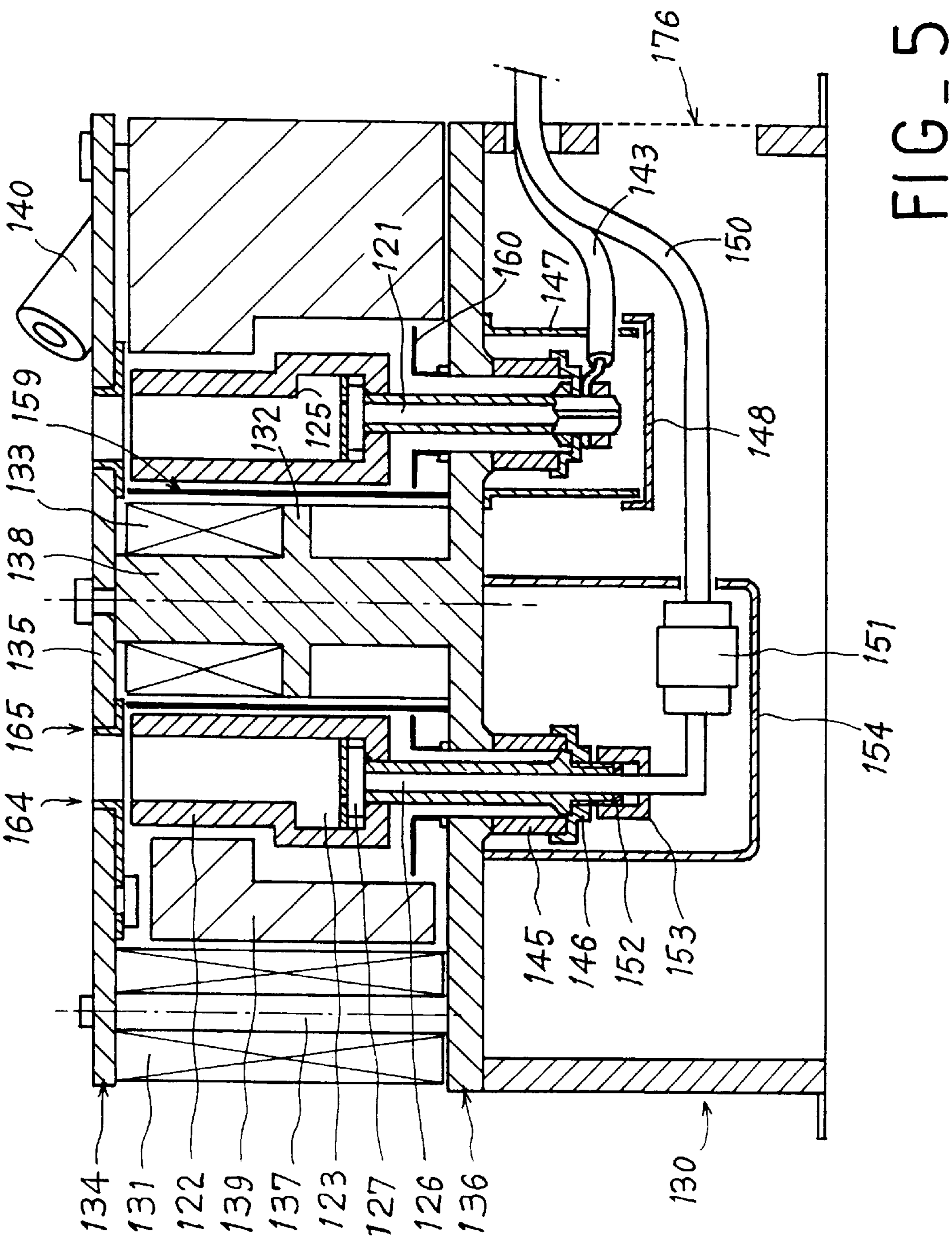
FIG. 5 is an axial section view of an ion source constituting a first embodiment of the invention.
Figure 6A:
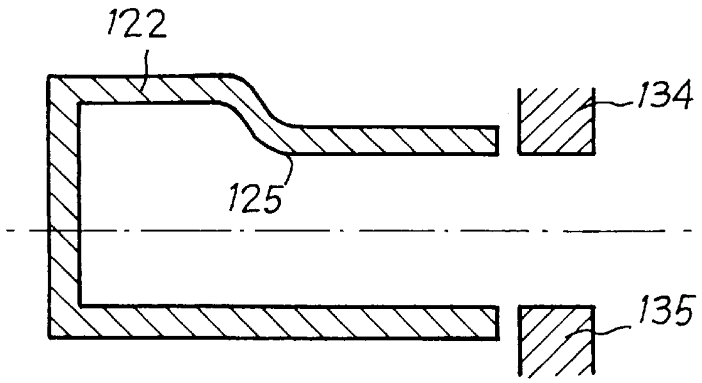
FIG. 6A is a diagrammatic section for explaining the operation of the ion source of the invention.

Reference is made initially to FIG. 5 which is an overall view in axial section of a first embodiment of a closed electron drift ion source of the invention, together with FIG. 6*a*, which is a diagrammatic section for explaining the operation of the ion source of the invention.

Figure 1:
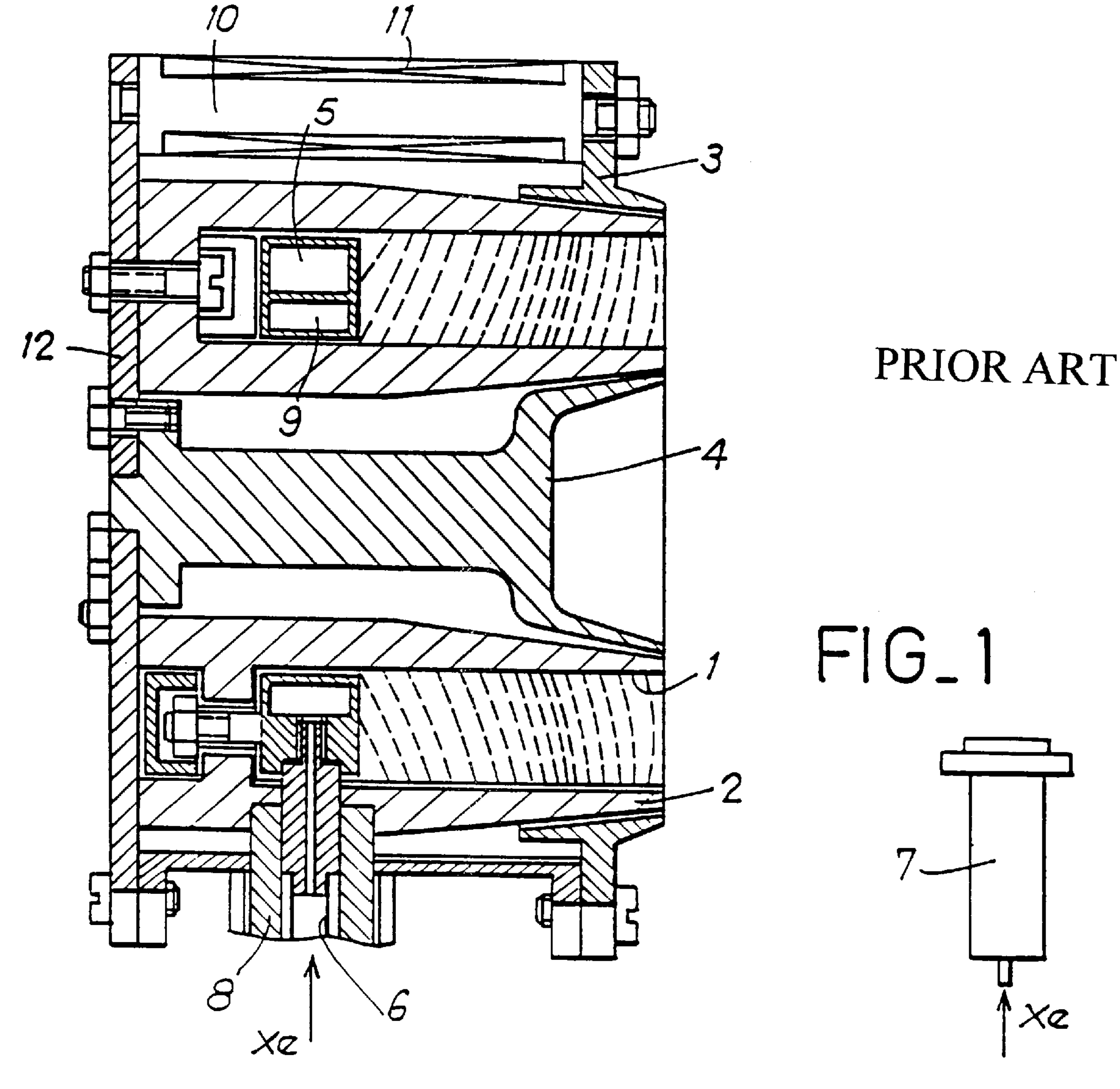
PRIOR ART FIG 1
FIG. 1 is an axial section view showing an example of a prior art closed electron drift plasma thruster.
Figure 2:
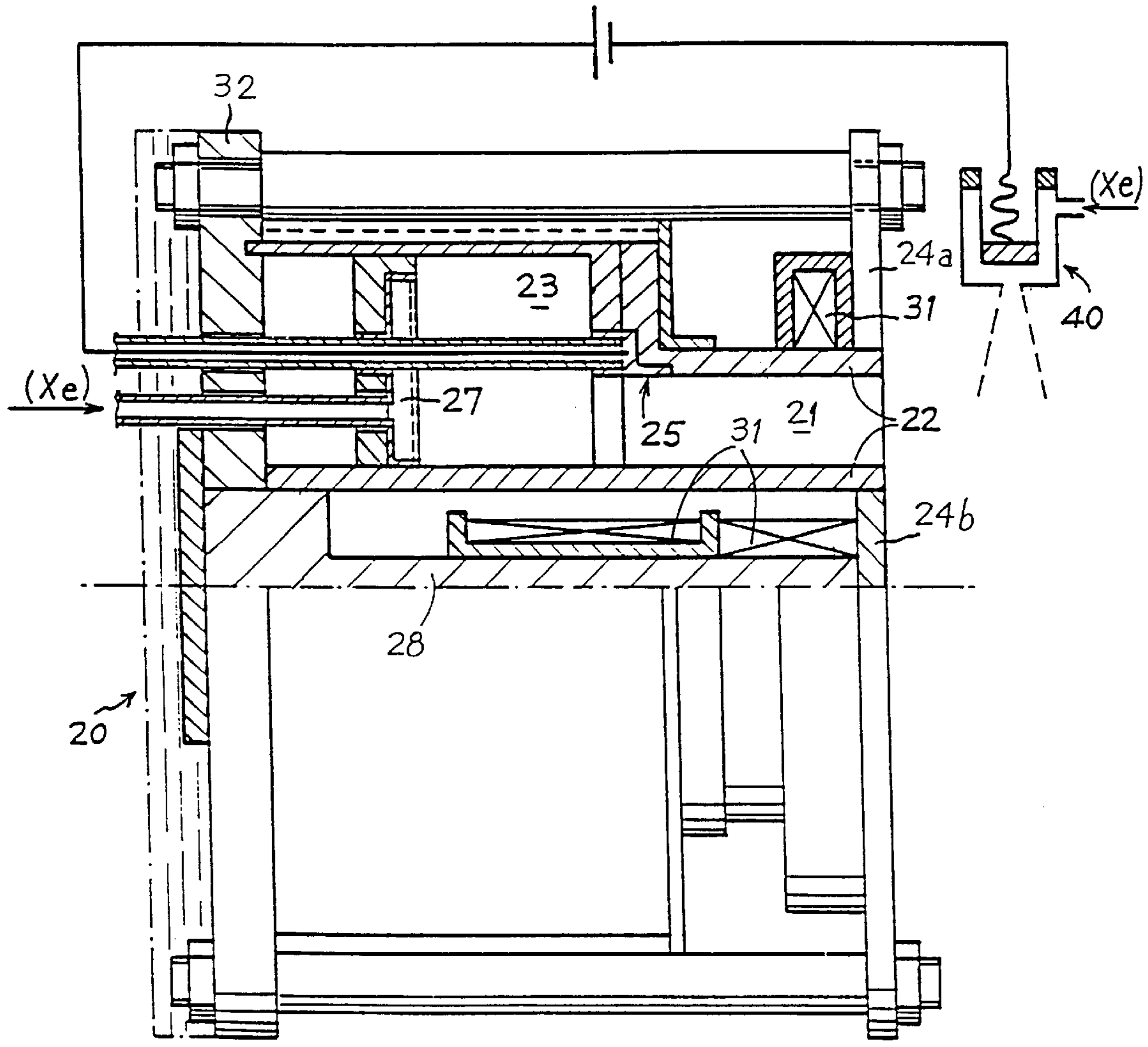
FIG 2 PRIOR ART
FIG. 2 is an axial section view showing another example of a prior art closed electron drift plasma thruster.
Figure 3:
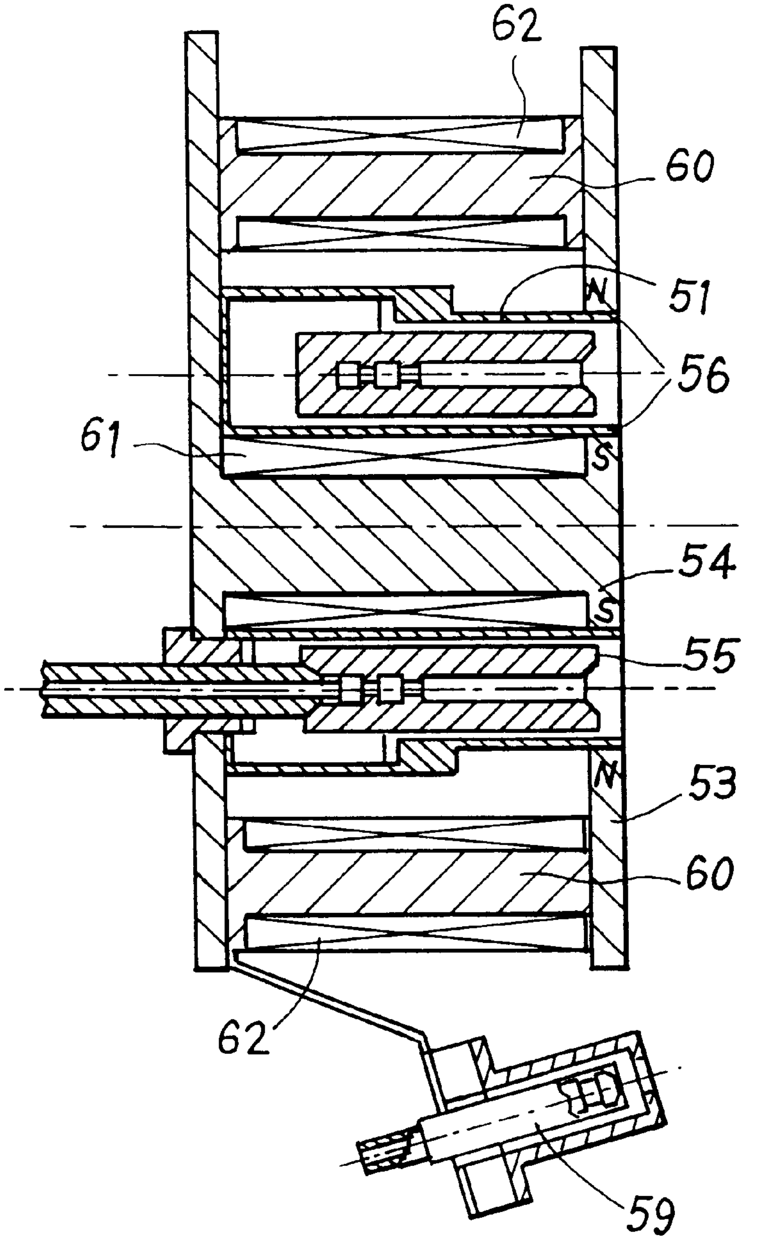
FIG 3 PRIOR ART
FIG. 3 is an axial section view showing an example of a prior art anode layer thruster.

The design and implementation of the annular channel are considerably simplified compared with a source for space use of the kind shown in FIG. 2.

A buffer chamber 123 of small dimensions and the upstream portion of a main annular acceleration channel together form a one-piece metal unit 122 referred to below as the "channel block" and acting in particular as an anode 125.

A magnetic circuit, constituted by a yoke 136, an axial core 138, a pole piece 132, an inner pole piece 135, tie bars 137, and an outer pole piece 134 define a maximum magnetic field in the gap defined between the pole pieces 134 and 135.

This field has a minimum in the vicinity of the pole piece 132. The field is created by an inner coil 133 and by one or more outer coils 131, thereby making it possible to adjust field distribution and thus control the divergence of the ion beam.

In its upstream portion, the channel block 122 comprises a bufferchamber 123 which is fitted with a gas injection manifold 127 fed by a pipe 126. The channel block 122 acting as an anode 125 is held by at least three posts 121, one of which may be constituted by the pipe 126 itself. The posts 121 and 126 are fixed on insulators 145 by nuts 146. The posts 121 and 126 can thus be separated from the insulators 145 to enable the annular channel block 122 to be disassembled. Electro-static masks 147, 148, and 154 serve to prevent discharges. Gas is delivered by means of a grounded tube 150, an insulator 151, and a coupling that includes a gasket 152 and a nut 153. This assembly is housed in a base 130 that serves as a support for the source.

The electric discharge that produces the ion beam is established between a hollow cathode 140 fed with a inert gas and the channel block 122 that forms the anode 125 that is fed with a pure gas or with a mixture of gases, and at least one of said gases possibly being reactive.

The nature of the material of the channel 122 can be adapted to the gas which is to be ionized while the nature of the guard rings 164 and 165 which are placed in line with the channel block 122 and downstream therefrom, where they are subjected to ion erosion, can be adapted both to the nature of the gas and to the requirements of the substrate to be treated (for example a semiconductor or a thin optical layer). In this context, the removable guard rings 164 and 165 disposed respectively in the outer pole piece 134 and the inner pole piece 135 can be made of carbon (having a low erosion rate), of a ceramic composite material (such as a composite comprising silicon, silicon nitride, and titanium nitride), of aluminum, of stainless steel, or of a noble metal (such as platinum or gold).

Another possibility is that the guard rings are made of one of the following insulating materials: boron nitride; alumina; and quartz.

Screens 139, 159, and 160 disposed outside the channel block 122 act both thermally and electro-statically relative to the channel block 122. They prevent excessive heating of the pole pieces and of the coils, and they define a field around the channel block 122 that prevents discharges. The main annular channel 122 is thus electrically and thermally insulated from the remainder of the source 139, 159, and 160 by vacuum, the gap between the annular channel 122 and the remainder of the source typically lying in the range 1 mm and 5 mm.

Figure 6B:
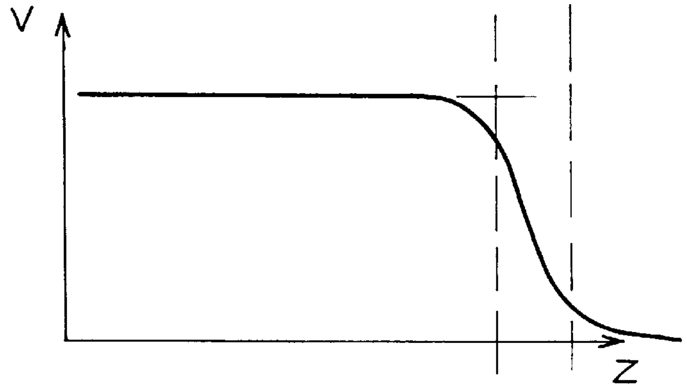
FIG. 6B is a graph showing the electric potential V of the plasma as a function of the position Z along an axial direction at the mean radius of the FIG. 6A channel.

Tests have shown that with a channel block 122 made entirely of a conductive material co-operating downstream with terminal pieces 134, 135, 164, and 165 raised to a different potential that is lower, and in particular ground potential, a profile of plasma potential along the middle axis of the channel 122 (FIG. 6B) is obtained that is substantially identical to that of stationary plasma thrusters (SPTs) of the first generation (FIG. 4C). It is thus possible to generate progressive ion acceleration in a channel made up of two zones raised to different potentials. The profile of the magnetic field in the plasma is determined by the thickness of the guard rings 164 and 165 protecting the pole pieces from erosion by the ions of the plasma.

How the nature of the wall of the channel is determined as a function of the kind of industrial treatment that makes use of the ions produced by the source depends essentially on a problem of chemistry due to the reaction between the wall and the partially-ionized plasma-generating gas. Since the walls are made of conductive material, in an ion source of the invention, it is now possible to use the source for an entire range of treatments for which conventional sources having their channels made of a ceramic material are not very suitable.

The channel block 122 is insulated relative to the yoke by means of three posts 121 provided with insulators 145. The front, side, and back faces of the channel block 122 are insulated relative to the parts that are at ground potential (i.e. the pole pieces 134 and 135 and the thermal screens 139 and 159) by means of a vacuum. The short distance between these walls (about 1 millimeter) and the low pressure ($2\times10^{-4}$ mbar to $5\times10^{-4}$ mbar) lead to a discharge voltage that is much greater than the operating voltage (in application of Paschen's law).

The channel block 122 receives the heat flux as radiated and dissipated by the plasma (as a result of inelastic collisions of ions and electrons). This corresponds to a power of several hundreds of watts for a 1.5 kW source. In order to avoid excessive heating of the coils, of the dismountable bond members 145, 153, and 152, and of the pole pieces whose temperature must always remain below the Curie point, heat losses from the channel block 122 forming the anode 125 to the remainder of the source are limited by special structural dispositions.

Thus, the only conductive bond with the source is constituted by the hollow support posts 121 and the gas feed duct 126.

The posts can be made of material having low conductivity (stainless steel, Inconel) so that the flow of heat conducted can be very low.

Also, it should be observed that the posts (and/or the gas feed duct) make it possible for the channel block 122 constituting the anode 125 to expand differentially relative to the magnetic yoke 136.

In addition, the radiated heat flux is limited:

a) by causing the outside faces of the channel block 122 forming the anode 125 to have low emissivity (e.g. by polishing said outside faces);

b) by disposing an antiradiation screen 159 between the channel block 122 forming the anode 125 and the coil 133, said screen also acting as an electrostatic screen; and c) by disposing an outer screen 139 that prevents radiation reaching the coils 131 and the pole piece 134.

Figure 7:
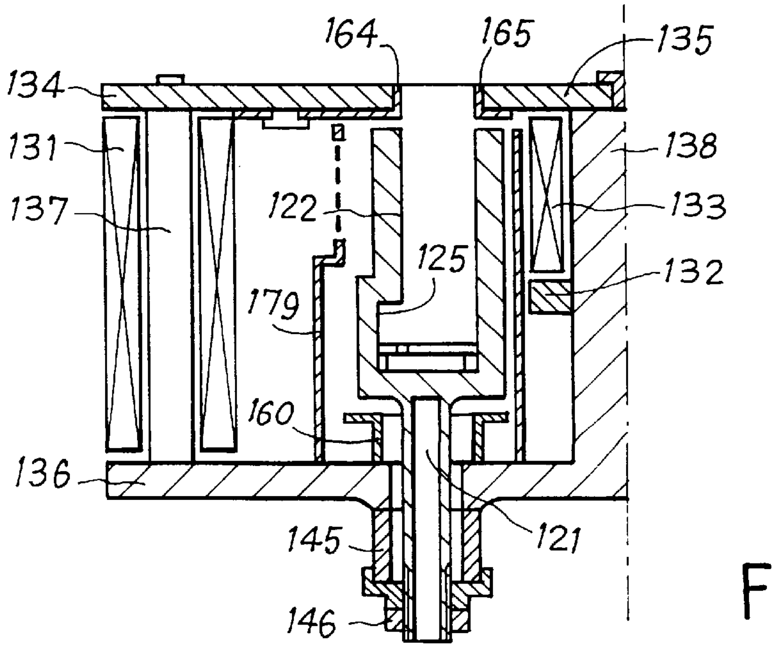
FIG. 7 is an axial section view of an ion source showing an alternative disposition for the first embodiment of the invention.

By way of example, the screen can be a solid block 139 as shown in FIG. 5 that dumps the heat flux over a large area, or a screen fitted with gridded windows 179 (shown in FIG. 7) enabling the channel block 122 forming the anode 125 to radiate directly over a certain solid angle.

Figure 8:
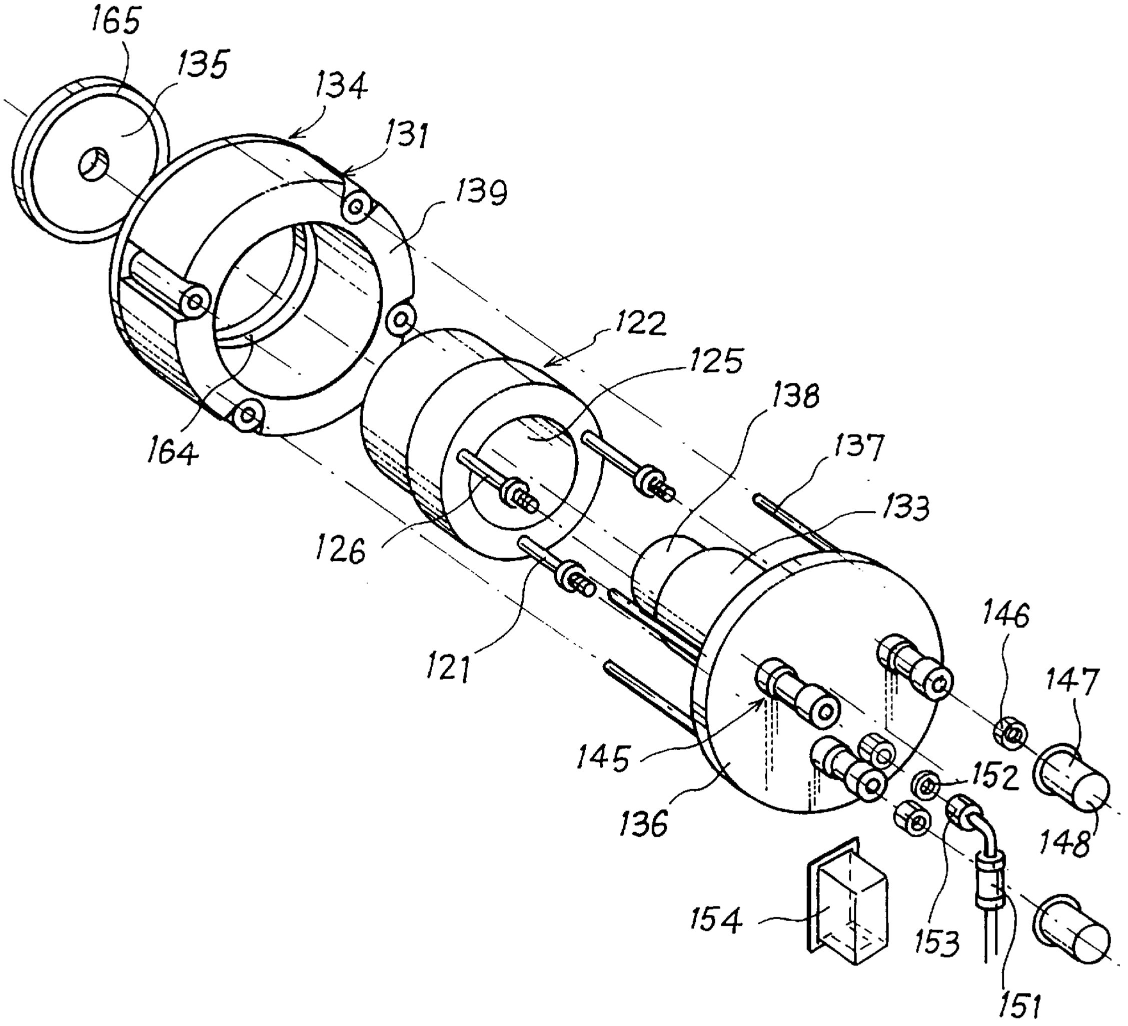
FIG. 8 is a perspective view showing how the various elements constituting the ion source of the first embodiment of the invention are assembled together.

Disassembly of the channel block is facilitated by the structural dispositions of the source as shown in FIG. 8.

The portion extending the channel block 122 downstream therefrom is subdivided into two rings that are removable and interchangeable. The outer ring 164 is mounted by screws on the outer pole piece 134, while the inner ring 165 is held in position by the inner pole piece 135. To change the rings 164 and 165, it therefore suffices to dismantle the pole pieces.

The gas manifold 127 is an integral portion of the buffer chamber 123.

The channel block 122 also constitutes an easily interchangeable metal part. To dismantle the channel block 122, it is necessary initially to withdraw the assembly constituted by the outer pole piece 134, the guard ring 164, and the screen 139, and the assembly constituted by the inner pole piece 135, and the guard ring 165. This first level of dismantling can be performed without altering adjustments and while keeping the source in place.

Thereafter, it suffices to remove the covers 148 and 154 to gain access to the nuts 146 enabling the posts 121 to be separated from the tube 126 in order to extract the channel block 122 axially.

The connection between the gas supply and the tube 126 is hermetic. A flat gasket 152 provides sealing between the two portions. The gasket is compressed by the nut 153. In order to give easy access to the nuts 146 and 153, the base 130 can be dismantled (FIG. 5). It is provided with a gridded degassing orifice 176 that serves to prevent penetration of the plasma that exists in the vacuum chamber inside the gap formed between the base 130 and the magnetic yoke 136. Advantageously, the cable 143 for biasing the anode 125, and the gas feed 150 pass into the interface between the yoke 136 and the base 130 so as to avoid impeding dismantling thereof.

Figure 9:
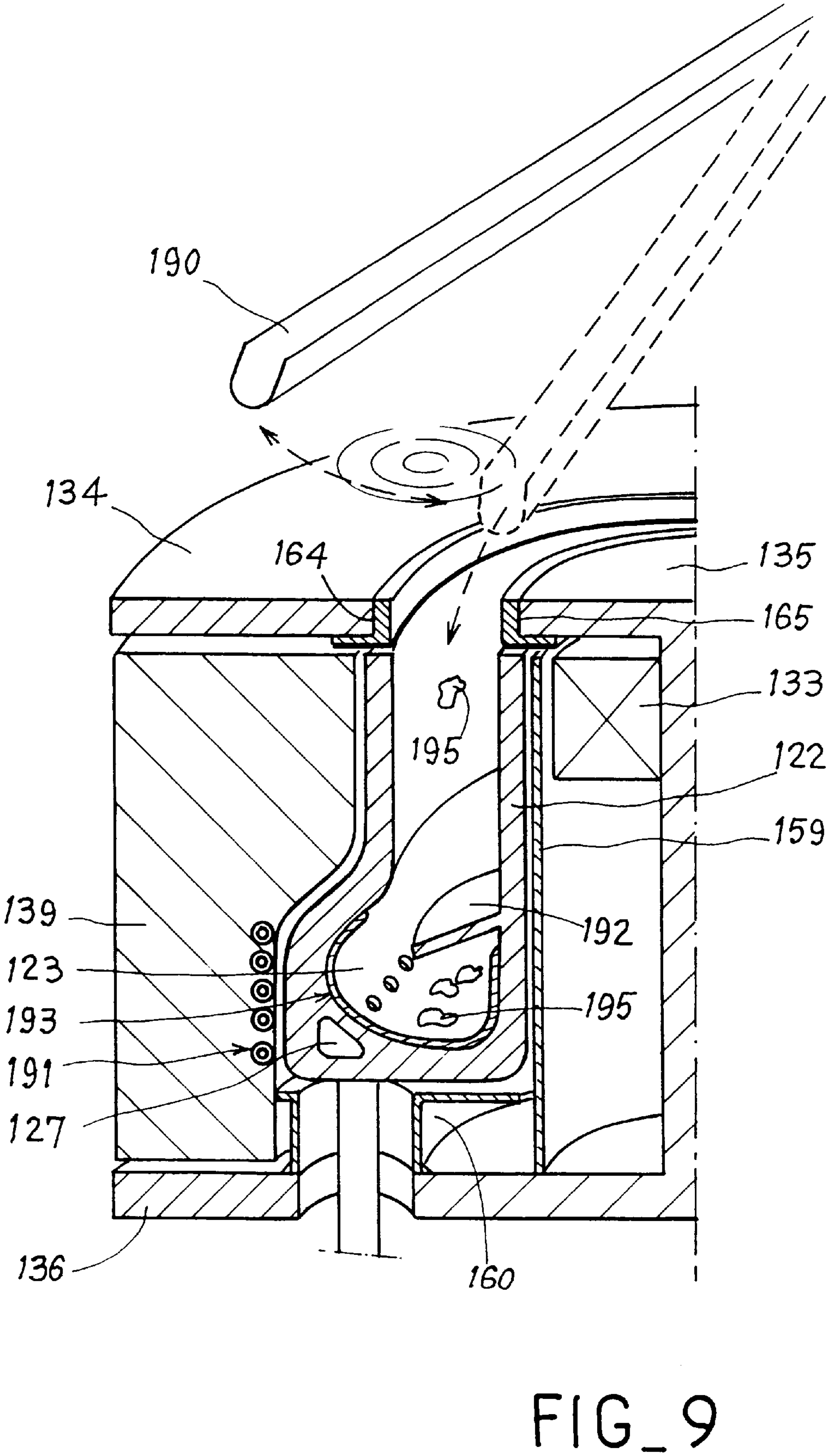
FIG. 9 is a view in perspective and in halfaxial section showing the first embodiment of an ion source of the invention and showing how the channel is fed with a sublimable solid.

FIG. 9 shows apparatus for feeding the channel block 122 with particles 195 of a solid that sublimes in a vacuum (metals having high vapor pressure, volatile oxides). This makes it possible to ionize such vapors (in part) in order to perform vacuum deposition, of substances that are reactive or otherwise.

In order to provide fine thermal control of the channel block 122, it is possible to provide the outer screen 139 with a heater element 191. It will be observed that the shape of the buffer chamber is similar to that of a crucible, thereby making it possible to ensure that the vapor flux is uniform. Where required, it is possible to insert into said chamber a conical shelf 192.

Figure 10:
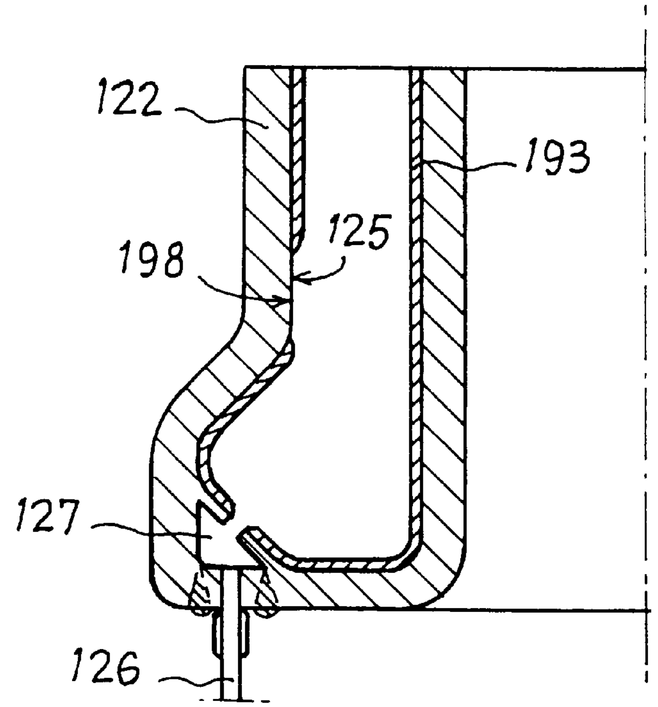
FIG. 10 is an axial half-section of the annular channel of an ion source in the first embodiment of the invention, showing how an insulating layer is deposited over part of the inside walls of the annular channel.

FIG. 10 shows a variant of the channel block 122 that is provided with an internal insulating deposit 193 to define a conductive zone 198 constituting the anode 125 facing a field minimum.

Figure 11:
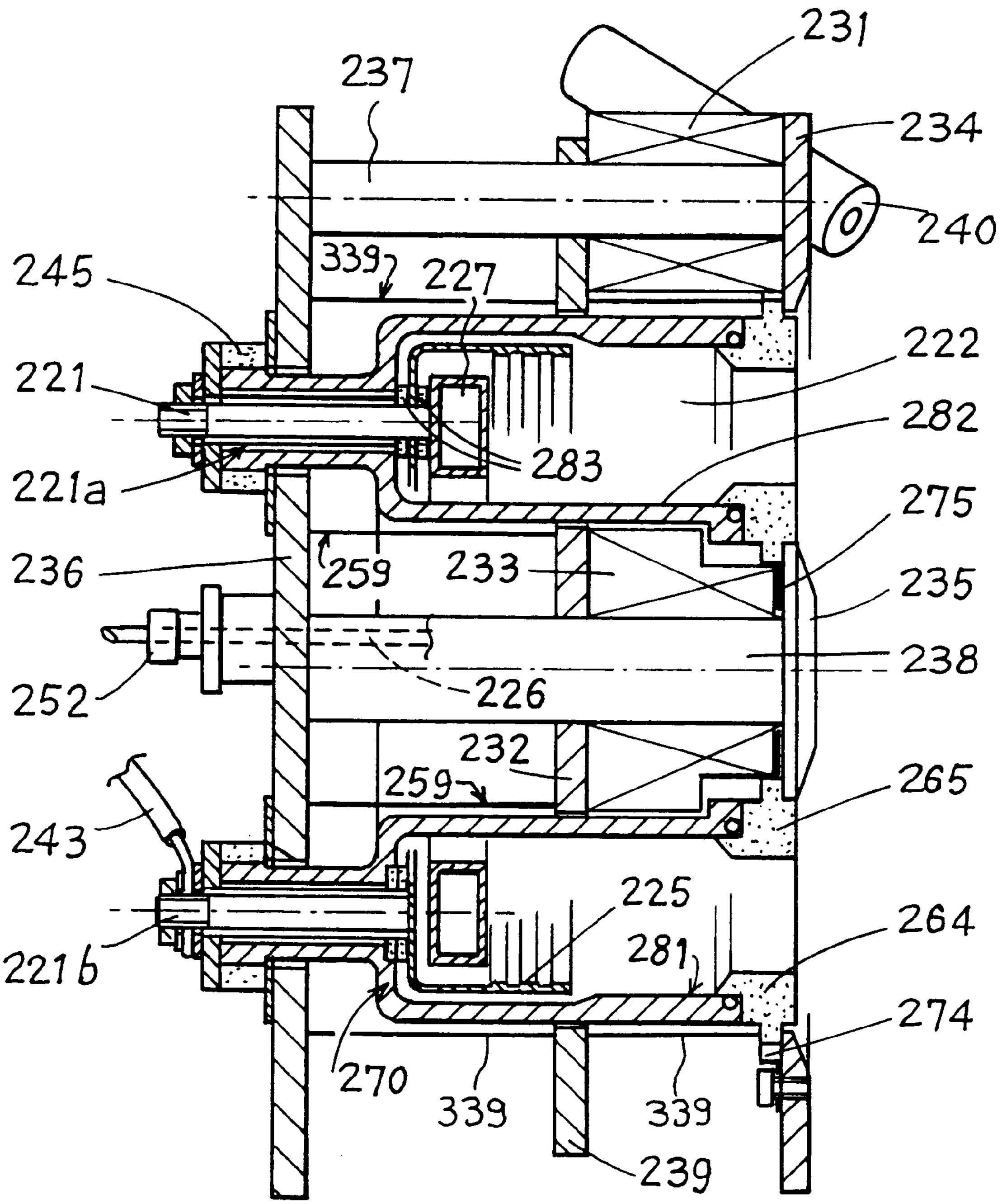
FIG. 11 is an axial section view of a closed electron drift ion source constituting a second embodiment of the invention.

FIG. 11 is an overall view in axial section of a second embodiment of a closed electron drift ion source of the invention.

This ion source comprises the following component elements: a hollow compensation cathode 240 disposed outside the source proper and downstream therefrom; a magnetic circuit comprising a yoke 236 disposed upstream from the source and bond bars 237, 238 connecting the yoke 236 to ring-shaped external and internal pole pieces 234 and 235 disposed downstream from the ion source; means 231 and 233 for creating magnetomotive force constituted by coils capable of being disposed for example around some of the bond bars 237, 238, and auxiliary pole pieces 232, 239 determining a field minimum in the vicinity of the anode; an annular channel block 222 for ionization and acceleration defined down-stream by outer and inner metal cylindrical walls 281 and 282 and extended in the acceleration zone by two annular parts 264 and 265 of dielectric (ceramic material) held facing inner and outer pole pieces 235 and 234 either by mechanical assembly (positioning between the pole piece and a metal holding piece), or else by brazing each ceramic ring 264, 265 to a metal support which is itself fixed by screws to the corresponding pole piece 234, 235.

The end of the buffer chamber receives a cylindrical anode 225 and a gas distributor 227, the anode 225 being held in place by insulators 283 compressed by the distributor 227 against the end wall of the chamber by means of tie rods 221 and spacers 221*a*.

The tie rod and spacer assemblies 221, 221*a* are mounted on insulators 245 that provide positioning relative to the magnetic circuit (and more particularly the yoke 236).

The distributor 227 is fed with gas by a pipe 226 and a coupling 252 mounted on an insulator 245.

Anode bias is provided by a tie bar 221*b* and a bias wire 243.

The anode 225 and the distributor 227 remain easy to dismantle.

The ion source also includes conductive electro-static screens 259 and 339 which envelop the annular channel 222.

The screens 259 and 339 can slide at their down-stream ends respectively on the outer ceramic ring 264 and on the inner ceramic ring 265.

The same applies to the channel 222 whose ends can be provided with a metal wire eliminating point effects, and thus any risk of discharge.

The empty space established between the electrically conductive screens 259, 339 and the metal walls 281, 282 is of substantially constant width (typically lying in the range 1 mm to 5 mm) so as to avoid any risk of electrical discharge between the walls 281, 282 and the screens 259, 339. The screens 259, 339 may be provided with respective grids to enable the space between said screens and the walls 281, 282 to be degassed.

The terminal pieces 264 and 265 are of a length along the acceleration channel 222 that extends at least over a zone corresponding to the length L in FIG. 4, i.e. the zone in which erosion takes place due to the ions.

As can be seen in FIG. 11, the electrically conductive walls 281 and 282 define a width for the acceleration channel 222 in the radial direction that can be greater than the width of the acceleration channel 222 defined in the radial direction by the terminal pieces 264 and 265 that are made of dielectric material.

This disposition makes it possible to avoid discontinuity appearing due to the transition between the deposition zone and the erosion zone, with deposition taking place in progressive manner on the surfaces 281 and 282.

Nevertheless, it should be observed that it is also possible to make a source in which the surfaces 281 and 282 are of the same diameter as the terminal pieces 264 and 265 or even of a smaller diameter (281) or a greater diameter (282) using a conical coupling, thereby making it possible to reduce the magnetic gaps of the auxiliary pole pieces 232 and 239.

As can be seen in FIG. 11, the electrically conductive walls 281 and 282 are electrically inter-connected by a conductive end wall 270 co-operating with the conductive walls 281 and 282 to constitute a one-piece unit which can itself be secured to the gas distributing assembly 227, wherein the 1-piece unit is at a floating potential that is slightly smaller than that of the anode.

The cylindrical surfaces 281 and 282 are connected to the end wall of the chamber 270 by radii of curvature that provide a surface that is smooth and that varies progressively. In this way, the electric field between the conductive surfaces 281 and 282 and the conductive screens 259 and 339 which are grounded does not suffer significant increase that could give rise to breakdown.

The upstream portion of the acceleration channel 222 is separated from the pole pieces 232 and 239 and also from the electrostatic screens 259 and 339 by an empty space. Thus, as in the embodiment of FIG. 5, the main annular channel 222 is electrically and thermally insulated from the remainder of the source 259, 339, 232, 239, and 236 by a vacuum, with the gap between the main annular channel 222 and the remainder of the source typically lying in the range 1 mm to 5 mm. In the embodiment of FIG. 11, the walls 281 and 282 of the annular channel 222 are electrically insulated from the remainder of the structural elements of the source, including the anode 225.

It is also possible to bring the auxiliary pole pieces 232 and 239 into contact with the electrostatic screens 259 and 339, still for the purpose of reducing the magnetic gap and improving control over the shape of the magnetic field.

The outside surfaces of the walls 281, 282 and 270 and also the inner and outer surfaces of the screens 259 and 339 can be polished so as to reduce radial radiation losses. This makes it possible, in particular, to reduce heat flux on the central coil 233 (FIG. 11).

In a variant embodiment, the outer surface of the outer wall 281 of the chamber and this surface only can be covered on the contrary with a high-emissivity coating, as can be faces of the screen 339, while the portion of the screen 259 facing the inner wall 282 remains polished. This disposition improves cooling by radiation of the conductive channel while preventing the central coil 233 from overheating.

The lifetime and the effectiveness of the ion source depend on operating phenomena that take place within the ionization layer.

The main phenomenon that determines lifetime is erosion of the terminal pieces 264 and 265 of the assembly comprising the discharge chamber and the acceleration channel 222, because of ions that have been accelerated striking the walls.

The integrity characteristics of the closed electron drift ion source are determined to a very large extent by the shape and the intensity of the magnetic field in the acceleration channel and they remain stable even when the downstream portion of the discharge chamber outlet is enlarged because of ion projection (see FIG. 4A). Significant deterioration in the effectiveness of thruster operation is observed only after complete projection of the ions has been achieved against the walls of the discharge chamber in the inter-pole gap of the magnetic system and when the poles 234 and 235 have themselves been subjected to significant amounts of projection. Under such circumstances, the changes in the shape and the magnetic field intensity are the main causes of degraded performance.

In the context of the present invention, the terminal pieces 264 and 265 of the walls of the discharge chamber and acceleration channel assembly are constituted by inserts of dielectric material of sufficient thickness and presenting increased resistance to being sprayed by accelerated ions, thereby increasing the lifetime of the ion source assembly.

In conventional closed electron drift ion sources, the walls of the discharge chamber (FIG. 4A) are made of materials having high resistance to thermal shock and to accelerated ion projections. It is known that aluminum oxide ceramics (alumina) are highly resistant to accelerated ion projections, but that they present insufficient thermal resistance leading rapidly to cracking of the walls of the chamber after a plurality of source starting cycles. These effects are attributed to the high temperature gradient that occurs during starting along the relatively thin walls of the chamber. Nevertheless, when as in the present invention use is made of inserts 264 and 265 of relatively small dimensions and made in the form of rings disposed in the vicinity of the chamber outlet, it is possible to obtain inserts that are made of alumina and that present satisfactory thermal resistance.

Also, given the shape of the curve (FIG. 4C) of plasma potential V, which remains substantially constant so long as the radial component $B_r$ of the magnetic induction remains below 0.6 $B_{rmax}$ or 0.8 $B_{rmax}$, depending on operating conditions, where $B_{rmax}$ designates the maximum value of the radial component $B_r$ (FIG. 4B), the technique of the invention whereby a conductive wall 281 or 282 replaces a wall made of dielectric material for the zone of the discharge chamber corresponding to the substantially constant portion of the curve V does not have any significant effect on the operating process within the source. This has been verified by various operating tests.

Because the inner and outer conductive walls 281 and 282 are electrically insulated from the remainder of the structure of the ion source, it is possible to impart a high degree of stability to the operating process of the ion source and to equalize the parameters of the plasma in the zone close to the anode 225.

In some cases, the walls 281 and 282 may nevertheless be likewise connected to the anode 225, via an electrical resistance.

By making electrically conductive walls 281 and 282 out of metal or out of a composite material, it is possible to reduce the overall mass of the ion source.

Nevertheless, account should be taken of the fact that the electrically conductive walls 281 and 282 are at a potential that is close to that of the anode, while in operation the structural elements of the magnetic system (elements 236, 237, and 238) are at a potential that is close to that of the cathode. In order to avoid discharges appearing between the magnetic system and the chamber, the chamber is surrounded by conductive screens 339 and 259 which are placed at a substantially constant small distance from the walls 281, 282, and 270.

A very strong bond can be made between the ceramic parts 264 and 265 and the support parts 274 and 275 by brazing.

Figure 12:
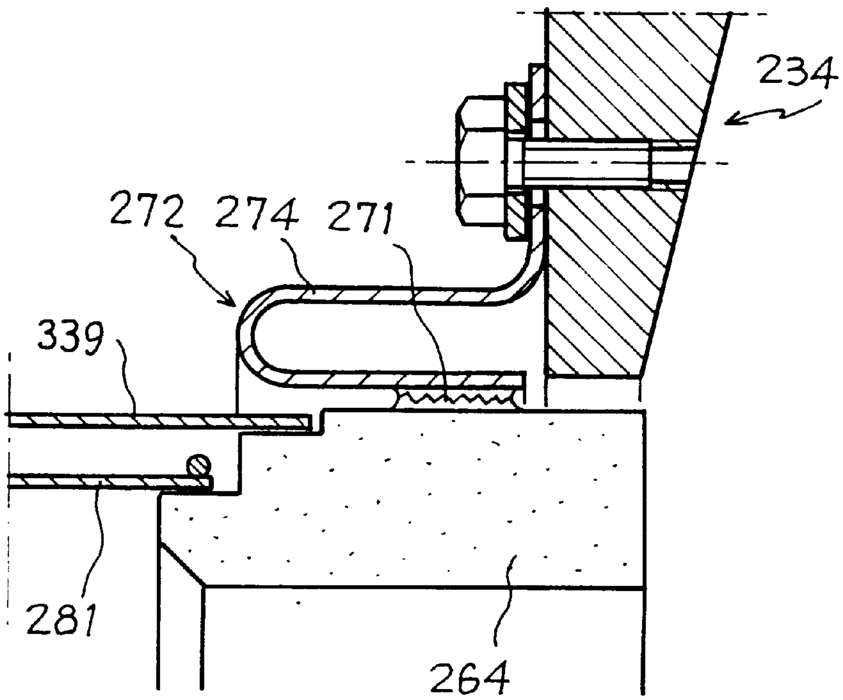
FIG. 12 is a detail view showing an example of a brazed bond that can be made between an insert of dielectric material and an electrically conductive support that serves to center the acceleration channel of an ion source constituting the second embodiment of the invention.

FIG. 12 shows an example of a brazed bond making differential expansion possible between a part 264 or 265 and a respective metal support 274 or 275 while complying with requirements for the electric field between the screen 339 or 259 and the wall 281 or 282, respectively.

To this end, the support 274 has a folded-back end 272 which is wetted by brazing 271 and the support 275 can be made identically.

I claim:

1. A closed electron drift ion source comprising a main annular channel for ionization and acceleration having an open downstream end, at least one hollow compensation cathode disposed outside the main annular channel, means for creating a magnetic field in the main annular channel, adapted to produce an essentially radial magnetic field in said channel having a gradient with maximum induction at the downstream end of the channel, first ionizable gas feed means associated with the hollow compensation cathode, and second ionizable gas feed means situated upstream from the main annular channel, and bias means co-operating with an anode;

wherein at least the internal portion of the main annular channel thereof is made of an electrically conductive material, and wherein terminal pieces raised to a potential that is lower than the potential of the anode extend the annular channel downstream therefrom.

2. An ion source according to claim 1, wherein at least a portion of the main annular channel is electrically biased by bias means so that at least a portion of the inner wall of the main annular channel directly constitutes said anode.

3. An ion source according to claim 2, wherein the main annular channel for ionization and acceleration is a one-piece unit constituted by an electrically conductive material.

4. An ion source according to claim 3, wherein the main annular channel constitutes a main annular channel block that is closed upstream by a bufferchamber fed with plasma-generating gas by said second gas feed means comprising an annular manifold connected to a feed pipe.

5. An ion source according to claim 4, wherein the means for creating a magnetic field comprise a magnetic circuit constituted by a yoke on which the main annular channel block is fixed, said yoke comprising an axial core supporting a central lower pole piece and a central upper pole piece that are concentric relative to the main annular channel block, said yoke also comprising a plurality of tie rods disposed around the annular channel block once it has been mounted on the yoke, said tie rods supporting a peripheral upper pole piece, said central and peripheral upper pole pieces constituting said terminal pieces taken to a potential that is lower than that of the anode, said upper pole pieces comprising guard rings disposed at the outlet of the main annular channel, which guard rings protect the pole pieces from erosion by ions in the plasma and, by means of their thickness, determine the profile of the magnetic field in the plasma.

6. An ion source according to claim 5, wherein the guard rings are removable so as to enable the nature of the material constituting them to be adapted to the application using the ion source.

7. An ion source according to claim 6, wherein the guard rings are made of one of the following conductive materials: carbon; carbon-carbon composite; nickel alloy; precious metal; ceramic composite constituted by nitrides bonded by silicon; silicon; stainless steel; and aluminum.

8. An ion source according to claim 6, wherein the guard rings are made of one of the following insulating materials: boron nitride; alumina; and quartz.

9. An ion source according to claim 5, wherein the annular channel block is fixed to the magnetic yoke by a plurality of posts made of thermally insulating material and held in place by insulators, said posts being capable of being disconnected from the insulators to enable the annular channel block to be dismantled.

10. An ion source according to claim 5, wherein the means for creating a magnetic field further comprise induction coils or permanent magnets interposed in the magnetic circuit.

11. An ion source according to claim 10, wherein the induction coils are mounted on tie bars.

12. An ion source according to claim 10, wherein said induction coils comprise at least a toroidal coil provided with an annular magnetic screen coaxial to the axial core.

13. An ion source according to claim 4, wherein the main annular channel block is made of one of the following conductive materials: refractory nickel alloy; molybdenum; and carbon-carbon composite.

14. An ion source according to claim 4, wherein a material to be evaporated is suitable for being deposited in the annular channel, and the inner walls of the annular channel are partially covered in an insulating deposit in order to avoid the electrically conductive material constituting said channel being attacked by the material to be evaporated.

15. An ion source according to claim 3, wherein the inner walls of the main annular channel are plated in a precious metal belonging to the group consisting of platinum, gold, and rhodium, in order to eliminate chemical attacks due to the gases present in said channel.

16. An ion source according to claim 1, wherein the main annular channel is electrically and thermally insulated from the elements constituting the remainder of the ion source by a vacuum environment and electrostatic screens, the gap between the main annular channel and the electrostatic screens lying in the range 1 mm to 5 mm.

17. An ion source according to claim 1, wherein the outer walls and the inner walls of the main annular channel are made of an electrically conductive material, and are electrically insulated from the anode.

18. An ion source according to claim 17, wherein the terminal pieces are made of a dielectric material covering a portion of the main annular channel.

19. An ion source according to claim 18, wherein said terminal pieces are made in the form of inserts of ceramic material bonded in metallic supports fastened to pole pieces by mechanical means.

20. An ion source according to claim 19, wherein the electrically conductive walls define a width of the annular channel in the radial direction that is greater than the width of the annular channel defined in the radial direction at said terminal parts.

21. An ion source according to claim 17, wherein the electrically conductive walls of the annular channel are electrically interconnected by a conductive end wall co-operating with the electrically conductive walls to constitute a one-piece unit, which unit is at a floating potential that is slightly smaller than that of the anode.

22. An ion source according to claim 21, wherein the electrically conductive walls of the annular channel are connected to the conductive end wall by radii of curvature that ensure a smooth surface.

* * * * *